United States Patent
Chhatre et al.

(10) Patent No.: US 9,947,512 B2
(45) Date of Patent: Apr. 17, 2018

(54) WINDOW AND MOUNTING ARRANGEMENT FOR TWIST-AND-LOCK GAS INJECTOR ASSEMBLY OF INDUCTIVELY COUPLED PLASMA CHAMBER

(75) Inventors: Rish Chhatre, Santa Clara, CA (US); David Schaefer, Alameda, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1449 days.

(21) Appl. No.: 13/280,750

(22) Filed: Oct. 25, 2011

(65) Prior Publication Data
US 2013/0098554 A1 Apr. 25, 2013

(51) Int. Cl.
*H01J 37/32* (2006.01)
(52) U.S. Cl.
CPC ....... *H01J 37/32119* (2013.01); *H01J 37/321* (2013.01); *H01J 37/3244* (2013.01)
(58) Field of Classification Search
CPC ............... H01J 37/32119; H01J 37/321; H01J 37/3244; H01J 37/32467; H01J 37/32458; H01J 2237/3323; H01J 2237/3344; H01J 37/32449; H01J 37/32477; H01J 37/32522; H01J 37/32532; H01J 37/32541; H01J 37/03
See application file for complete search history.

(56) References Cited

U.S. PATENT DOCUMENTS

| | | | |
|---|---|---|---|
| 5,643,394 A | 7/1997 | Maydan et al. | |
| 5,824,605 A | 10/1998 | Chen et al. | |
| 5,990,017 A * | 11/1999 | Collins | H01L 21/31116 |
| | | | 216/67 |
| 7,147,749 B2 * | 12/2006 | Nishimoto | C23C 16/4404 |
| | | | 118/723 E |

(Continued)

FOREIGN PATENT DOCUMENTS

| | | |
|---|---|---|
| JP | H08288266 A | 11/1996 |
| JP | 2011029645 A | 2/2011 |
| WO | WO-2010111055 A2 | 9/2010 |

OTHER PUBLICATIONS

International Search Report and Written Opinion dated Jan. 2, 2013 for PCT/US2012/061029.

(Continued)

*Primary Examiner* — Gordon R Baldwin
*Assistant Examiner* — Mirza Israr Javed

(57) ABSTRACT

An improved gas injection assembly for mounting in a central bore of a dielectric window of an inductively coupled plasma chamber includes a window having a central bore and cylindrical recess configured to receive an annular insert having a bayonet opening. The gas injector assembly includes a gas injector, an RF shield surrounding the gas injector, and a faceplate surrounding the RF shield, the faceplate including projections at the bottom thereof for engaging the bayonet opening in the annular insert. The window and gas injection assembly are designed to avoid chipping of the window which is typically made of quartz (Continued)

and in prior mounting arrangements the window has a bayonet opening machined therein. Due to the brittle nature of the quartz material, the machined bayonet opening was subject to chipping when the gas injector assembly was inserted into the bayonet opening.

24 Claims, 9 Drawing Sheets

(56) References Cited

U.S. PATENT DOCUMENTS

| | | | |
|---|---|---|---|
| 7,479,304 B2* | 1/2009 | Sun | C04B 41/009 427/289 |
| 7,685,965 B1* | 3/2010 | Hao | H01J 37/32477 118/723 I |
| 7,785,417 B2 | 8/2010 | Ni et al. | |
| 8,025,731 B2 | 9/2011 | Ni et al. | |
| 2001/0010257 A1* | 8/2001 | Ni | H01J 37/3244 156/345.33 |
| 2003/0070620 A1* | 4/2003 | Cooperberg | C23C 16/45574 118/723 AN |
| 2004/0149212 A1* | 8/2004 | Cho | C23C 16/45561 118/715 |
| 2004/0238487 A1* | 12/2004 | Kiehlbauch | C03C 15/00 216/52 |
| 2008/0282979 A1* | 11/2008 | Chen | H01J 37/32192 118/722 |
| 2009/0159424 A1 | 6/2009 | Liu et al. | |
| 2010/0003824 A1* | 1/2010 | Kadkhodayan | H01J 37/32091 438/710 |
| 2010/0041238 A1 | 2/2010 | Cooperberg et al. | |
| 2010/0243164 A1* | 9/2010 | Sharpless | H01J 37/321 156/345.33 |
| 2010/0261354 A1* | 10/2010 | Bettencourt | H01L 21/67069 438/710 |
| 2011/0056626 A1* | 3/2011 | Brown | H01J 37/321 156/345.33 |
| 2011/0097900 A1* | 4/2011 | Augustino | H01J 37/32467 438/710 |
| 2011/0146571 A1* | 6/2011 | Bartlett | C23C 16/4401 118/667 |
| 2012/0152901 A1* | 6/2012 | Nagorny | H01J 37/321 216/68 |
| 2013/0292055 A1* | 11/2013 | Setton | H01J 37/32119 156/345.1 |

OTHER PUBLICATIONS

International Preliminary Report on Patentability dated Apr. 29, 2014 for PCT/US2012/061029.

Office Action for Japanese Application No. 2014-538847 dated Oct. 25, 2016 with translation; 7 pages.

* cited by examiner

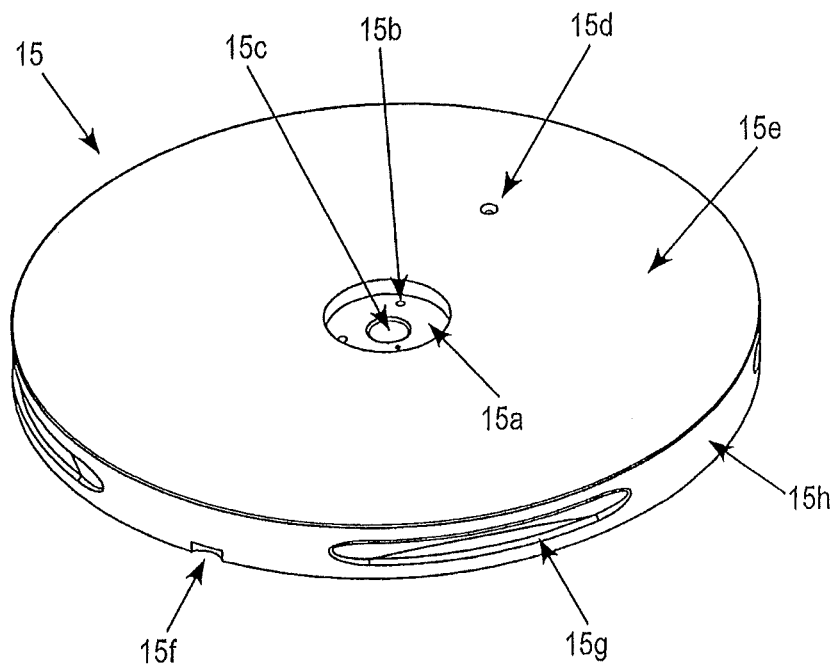
FIG. 3A
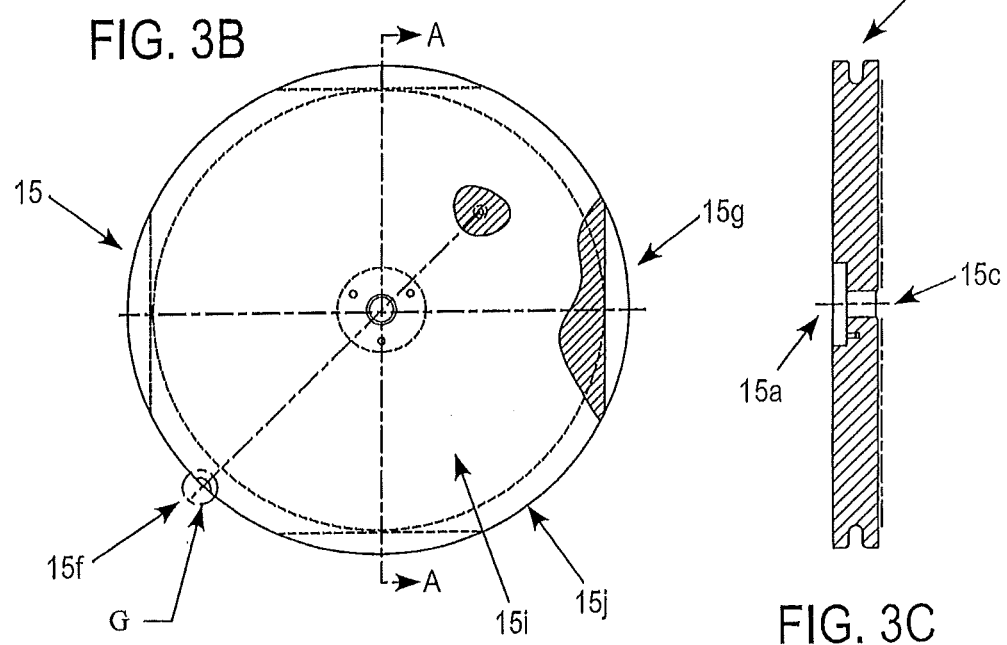
FIG. 3B
FIG. 3C

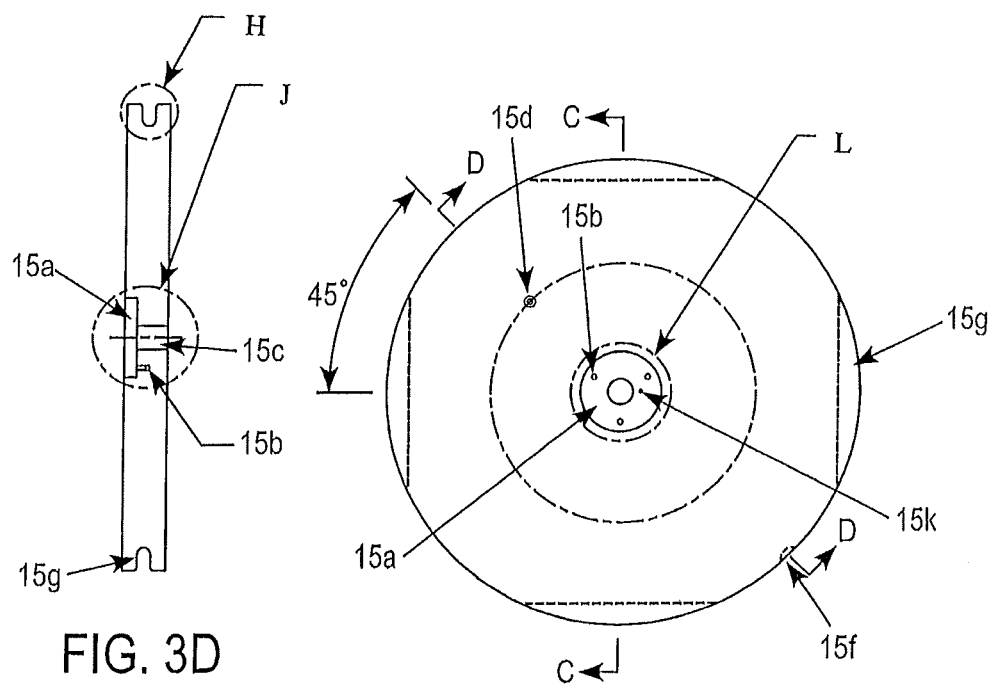
FIG. 3D
FIG. 3E
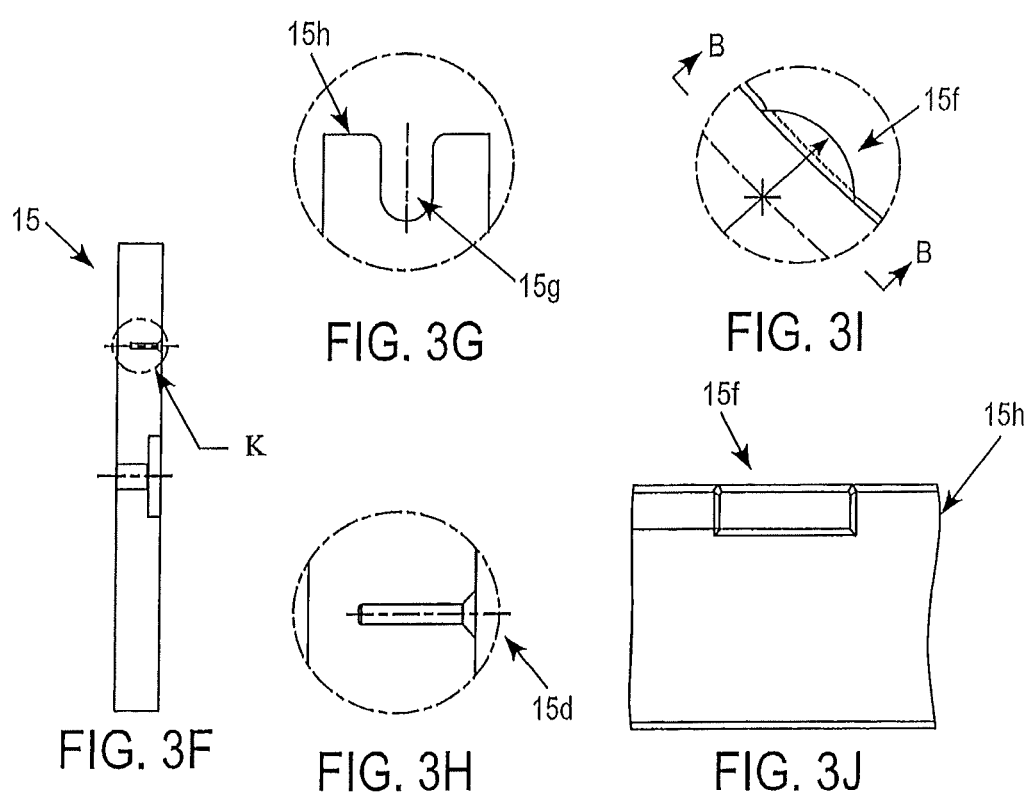
FIG. 3F
FIG. 3G
FIG. 3I
FIG. 3H
FIG. 3J

WINDOW AND MOUNTING ARRANGEMENT FOR TWIST-AND-LOCK GAS INJECTOR ASSEMBLY OF INDUCTIVELY COUPLED PLASMA CHAMBER

FIELD OF THE INVENTION

The invention relates to components of a plasma processing chamber in which semiconductor substrates are processed.

SUMMARY

According to one embodiment, a dielectric window of a plasma processing chamber is provided. The window forms a top wall of an inductively coupled plasma chamber wherein semiconductor substrates are plasma processed. The plasma is generated by energizing a process gas into a plasma state. The process gas is supplied into the chamber by a gas injector assembly comprising a gas injector, RF shield, faceplate and annular insert mounted in a central bore in the window. The window comprises a disk having a uniform thickness, a lower vacuum sealing surface on a lower surface thereof adapted to seal against an upper surface of the plasma processing chamber, a central bore configured to receive the gas injector which delivers process gas into the center of the plasma processing chamber, and an upper recess in the upper surface surrounding the central bore and configured to receive the annular insert used to mount the gas injector assembly in the window.

According to another embodiment, the insert is an annular insert adapted to fit in the upper recess in the dielectric window. The annular disk has a uniform thickness and is adapted to be received in the upper recess, the disk having a cylindrical outer wall, an upper surface, a lower surface, and a bayonet opening extending between the upper and lower surfaces

BRIEF DESCRIPTION OF THE DRAWINGS

FIGS. 2A-C show cross sections of a replaceable window and gas injector assembly for a plasma reaction chamber wherein FIG. 2A shows the gas injection assembly connected to a gas supply, FIG. 2B shows the gas injection assembly without the gas supply attached, and FIG. 2C shows details of a gas injector, RF shield, and faceplate held in an annular insert bolted into the dielectric window.

FIGS. 3A-M show details of a quartz window as described herein wherein FIG. 3A is a perspective view of the window, FIG. 3B is a bottom view of the window, FIG. 3C is a side view of the window along line A-A in FIG. 3B, FIG. 3D is a view along the line C-C in FIG. 3E, FIG. 3E is a top view of the window, FIG. 3F is a view along the line D-D in FIG. 3E, FIG. 3G is a view of detail H in FIG. 3D, FIG. 3H is a view of detail K in FIG. 3F, FIG. 3I is a view of detail G in FIG. 3B, FIG. 3J is a view along the line B-B in FIG. 3G, FIG. 3K is a view of detail J in FIG. 3D, FIG. 3L is a view of detail L in FIG. 3E, and FIG. 3M is a view along line E-E in FIG. 3L.

FIGS. 4A-C show details of a gas injector wherein FIG. 4A is a perspective view of the injector, FIG. 4B is a top view of the injector and FIG. 4C is a side view of the injector.

FIGS. 5A-C show details of an annular insert with a bayonet opening wherein FIG. 5A is a perspective view of the insert, FIG. 5B is a top view of the insert and FIG. 5C is a view along line A-A in FIG. 5B.

FIGS. 6A-C show details of an RF shield which surrounds the gas injector wherein FIG. 6A is a perspective view of the RF shield, FIG. 6B is a top view of the RF shield, and FIG. 6C is a side view of the RF shield.

FIGS. 7A-D show details of a faceplate which surrounds the RF shield and mounts the gas injector by a twist and lock arrangement into the annular insert wherein FIG. 7A is a top view of one half of the face plate, FIG. 7B is a perspective view of the outer side of one half of the faceplate, FIG. 7C is a perspective view of the inside of one half of the faceplate, and FIG. 7D is a side view of one half of the faceplate.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. As used herein, the term "about" should be construed to include values up to 10% above or below the values recited.

Described herein is a replaceable window and gas injector assembly of a plasma reaction chamber in which semiconductor substrates can be processed. The window and gas injection assembly are designed to avoid chipping of the window which is typically made of quartz and in prior mounting arrangements the window has a bayonet opening machined therein. Due to the brittle nature of the quartz material, the machined bayonet opening was subject to chipping when the gas injector assembly was inserted into the bayonet opening.

The replaceable window is made from a dielectric material, such as quartz and has the shape of a disk of uniform thickness. A central recess in the upper surface is configured to receive an annular insert having a bayonet opening and a central bore in the window receives a gas injector having a distal end flush or below the bottom surface of the window to deliver process gas into the chamber. An induction coil (not shown) above the window energizes the process gas into a plasma state for processing the substrate. For example, an etch gas can be supplied by the injector for plasma etching the substrate.

The gas injector can include one or more gas outlets, a flange which sits on the bottom wall of the central recess is vacuum sealed to the window with an O-ring which fits in a groove on the bottom of the flange. An RF shield surrounds the gas injector and a faceplate surrounds the RF shield. The faceplate is a two piece part which is bolted together around the RF shield and the faceplate includes protrusions (lugs) to engage the bayonet opening in the insert.

Figure 1:
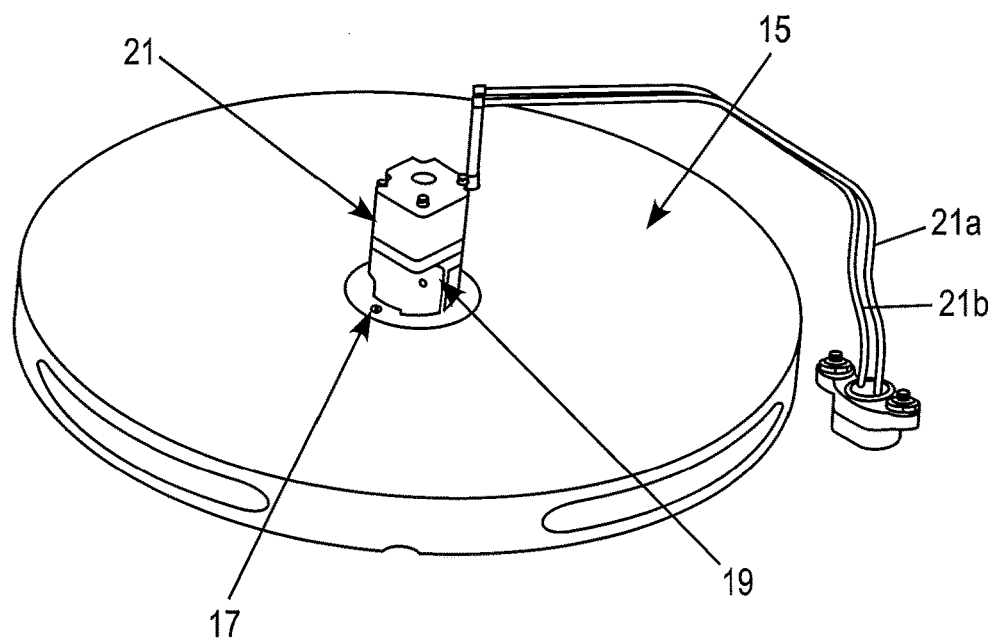
FIG. 1 shows a replaceable window and gas injector assembly for an inductively coupled plasma reaction chamber.

The insert with the bayonet opening can comprise any material that has a higher tensile strength than quartz such as plastic material. Alternatively, the insert with the bayonet opening can be made of ceramic, metal, silicon carbide, graphite, etc. In a preferred embodiment the insert with the bayonet opening is attached to the window with bolts threaded into TORLON inserts 20a (see FIG. 2C) fitted in mounting holes in the window. However, the insert can have threads which can be screwed into the window or the insert can be bonded to the window FIG. 1 shows details of a window 15 having a gas injection assembly mounted in the center thereof. The gas injection assembly includes a faceplate 19 engaging an insert 17 having a bayonet opening. The gas injection assembly is connected to a gas connection block 21 which receives process gas from supply lines 21a, 21b and an injector extending through the window delivers the process gas to the chamber for processing a semiconductor wafer.

Figure 2A:
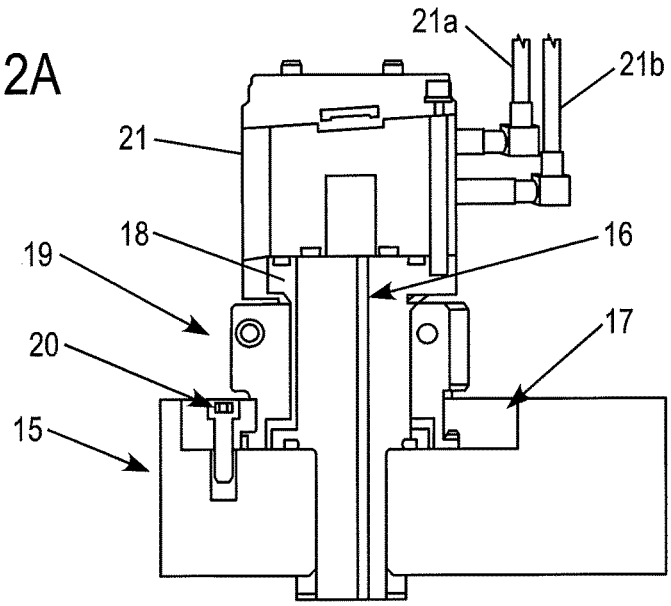
Figure 2B:
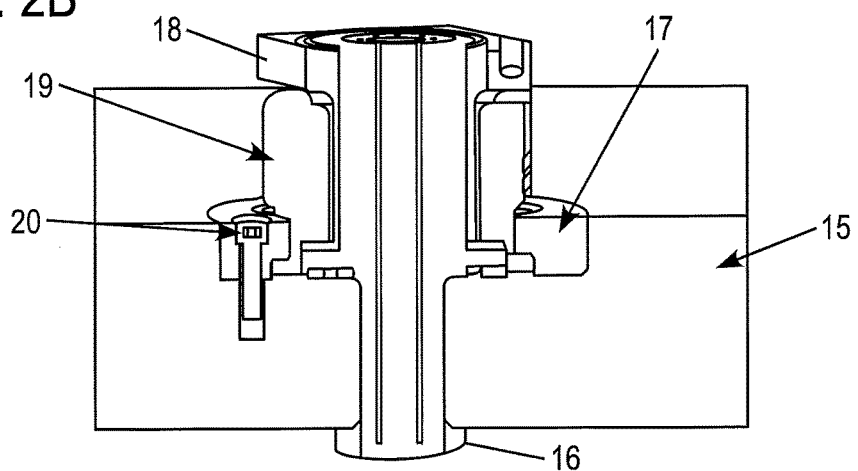
Figure 2C:
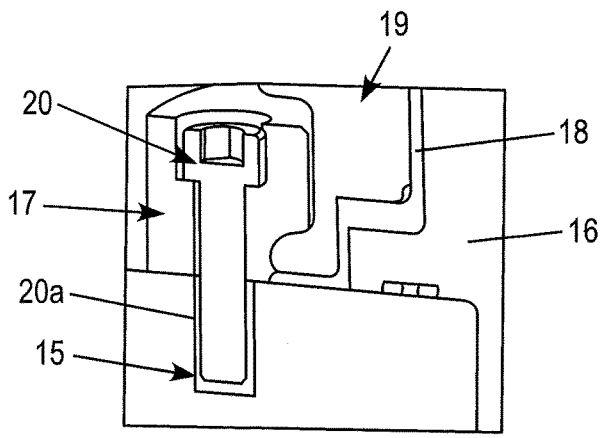

Details of a replaceable window and gas injector assembly of an inductively coupled plasma chamber are illustrated in FIGS. 2A-C. The parts include a quartz window 15, a gas injector 16, an annular insert 17 which is secured to the window by bolts 20, an RF shield 18, and a faceplate 19. A shown in FIG. 2A, the gas injection assembly (the gas injector 16, the RF shield 18 and the faceplate 19) is attached to the gas connection block 21. As described later, the faceplate 19 includes three projections which engage the bayonet opening of the insert 17 in a twist-and-lock fashion.

FIG. 3A shows details of the window 15 which includes a central cylindrical recess 15a for receipt of the annular insert 17, and 3 threaded or blind holes 15b for receipt of bolts 20 which can be threaded into the window or into threaded inserts fitted in the holes 15b to attach the insert 17 to the window 15. The window includes a central bore 15c for receipt of the gas injector 16 and at least one blind hole 15d in the upper surface 15e for receipt of a temperature sensor. A clocking feature 15f is provided in the bottom outer side surface 15h and elongated channels 15g are located in the outer side surface 15h.

FIG. 3B is a bottom view of the window shown in FIG. 3A, with an area indicated for detail G. The bottom surface 15i of the window has an annular vacuum sealing surface 15j. The window preferably has an outer diameter of about 20 inches, and the vacuum sealing surface extends about 1 inch in from the outer edge of the window. The clocking feature 15f is formed by a recess having a diameter of about 0.4 inch and height of about 0.3 inch.

FIG. 3C is a cross section of the window taken along line A-A in FIG. 3B. The window preferably has a thickness of about 1.75 inch, the channels 15g have a width of about 0.6 inch, extend about ⅛th of the circumference of the window and are located in the middle of the side surface 15h, the cylindrical recess 15a has a diameter of about 3.4 inches and a depth of about 0.5 inch.

FIG. 3D is a cross section of the window with areas indicated for views of details H and J, FIG. 3E is a top view of the window with areas indicated for section line C-C and detail L, and FIG. 3F is a side view of the window with an area indicated for detail K.

FIG. 3G is a view of detail H and shows a cross section of one of the channels 15g in the outer surface 15g of the window. The channel has a non-uniform depth extending into the outer surface 15h such that the depth is a maximum at the midpoint of the channel. As shown in FIG. 3C, the channel has planar sidewalls which are parallel to the upper and lower surfaces of the window and the sidewalls are connected by a rounded bottom wall. The sidewalls are preferably about 0.6 inch apart and the rounded bottom wall has a radius of curvature of about 0.3 inch. The rounded bottom wall extends rectilinearly between two locations along the outer surface 15h such that the channel has a maximum depth of about 0.9 inch at its midpoint. As shown in FIG. 3E, the bottom walls of the channels on opposite sides of the window are, parallel to each other. As shown in FIG. 3E, the blind hole 15d is located 45° from the midpoint of one of the channels 15g. FIG. 3H is a view of detail K and shows relative dimensions of the blind hole 15d which preferably has a diameter of about 0.22 inch, a depth of about 1.2 inches and a tapered opening with a diameter of about 0.48 inch extending into the upper surface 15e.

FIG. 3I is a top view of detail G and shows relative dimensions of clocking feature 15f. FIG. 3J is a side view along line B-B in FIG. 3I. FIG. 3I shows that the clocking feature 15f includes a planar wall parallel to the lower surface of the window and a curved sidewall which preferably has a radius of about 0.6 inch and depth of about 0.3 inch.

Figure 3K:
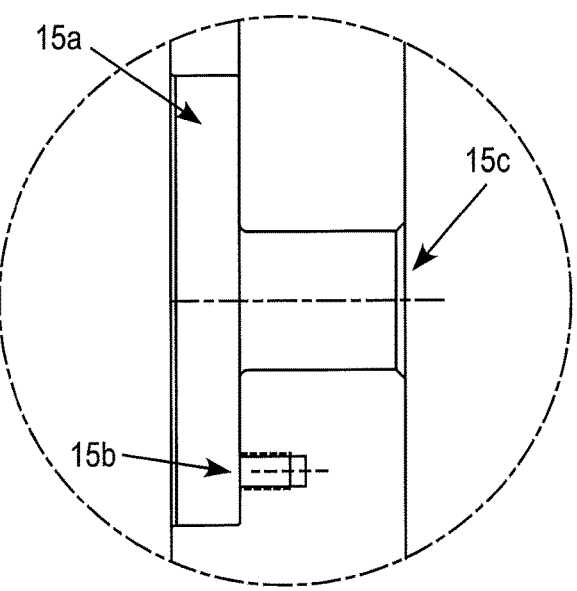
Figure 3M:
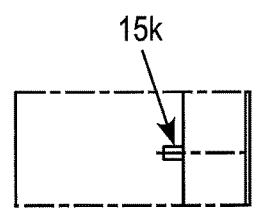
Figure 3L:
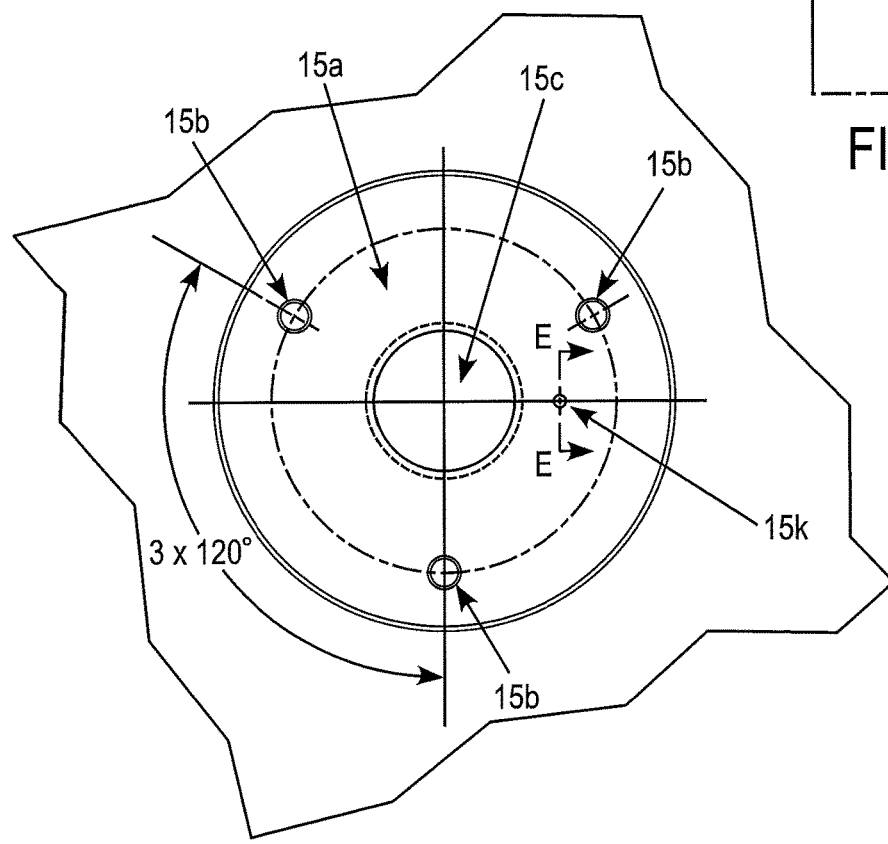

FIG. 3K shows relative dimensions of the cylindrical recess 15a which preferably is a circular recess with a diameter of about 3.4 inches and a depth of about 0.5 inch. The three threaded holes 15b are located 120° apart and about 1.25 inches from the center of central bore 5c. The threaded holes can have diameters of about 0.4 inch and a depth of about 0.5 inch and can be machined ¼-32 threaded holes or contain threaded polymer sleeves such as threaded TORLON sleeves to engage the bolts 20. The central bore 15c preferably has a diameter of about 1 inch and depth of about 1.25 inches, upper and lower edges of the central bore being rounded with a radius of curvature of about 0.06 inch. The bottom of the cylindrical recess 15a is preferably polished to provide a vacuum sealing surface and upper and lower edges of the recess 15a are preferably rounded with a radius of curvature of about 0.02 inch. A blind alignment hole 15k is located about 0.9 inch from the center of central bore 15c and preferably has a diameter of about 0.09 inch and a depth of about 0.15 inch. FIG. 3M is an enlarged view of alignment hole 15k along line E-E in FIG. 3L.

Figure 4A:
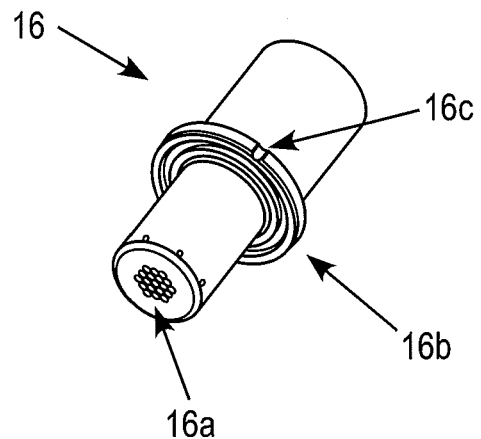

FIG. 4A shows details of the gas injector 16 which has a group of inner gas outlets 16a, a group of outer gas outlets 16d and a flange 16b, the injector configured such that the end with the outlets 16a and 16d fits in the central bore 15c in the window 15 and the flange 16b rests on the bottom of the cylindrical recess 15a of the quartz window.

Figure 4B:
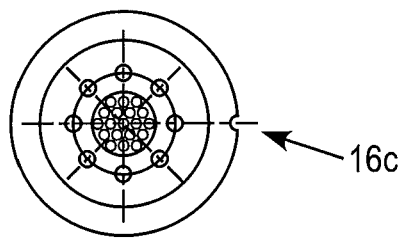
Figure 4C:
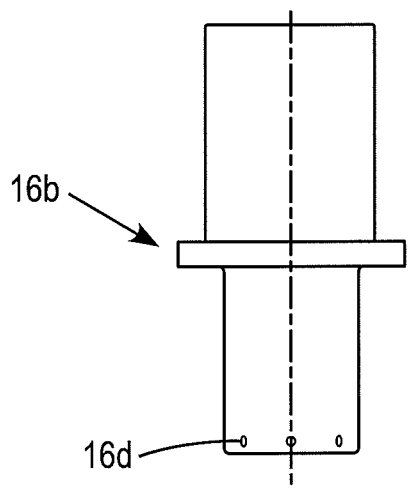

FIG. 4B is a bottom view of the gas injector which shows the details of an inner group of gas outlets 16a and an outer group of gas outlets 16d, the inner and outer outlets supplied the same or different gas at adjustable flow rates. The gas injector 16 has 19 inner gas outlets 16a arranged on the distal end of the gas injector 16 in a hexagonal arrangement and the outlets 16a are oriented to inject gas axially toward a substrate undergoing processing. Eight outer outlets 16d are arranged 45° apart around the side of the injector and inject gas in a conical path towards the substrate. The lower end of the injector has a diameter of about 1 inch and the flange has a clocking feature 16c. FIG. 4C shows the details and dimensions of a side view of the gas injector shown in FIG. 4A.

Figure 5A:
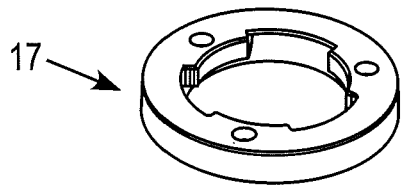
Figure 5B:
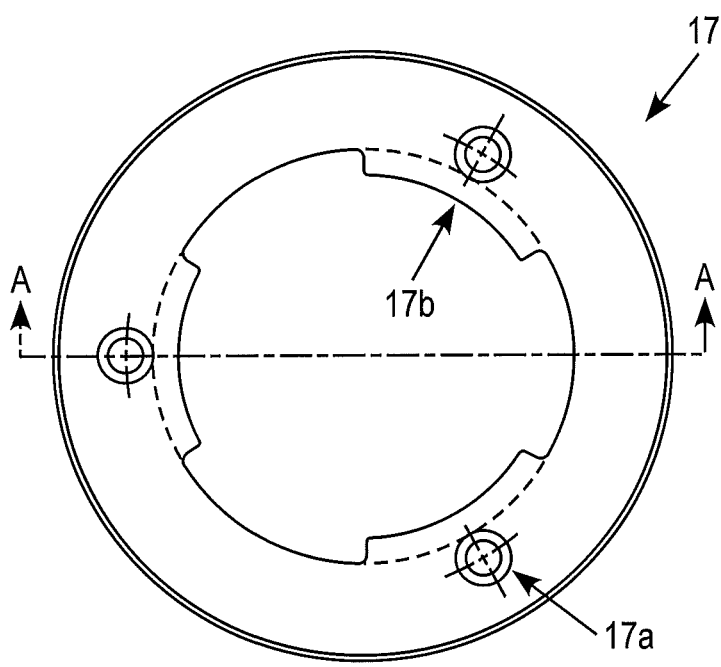
Figure 5C:
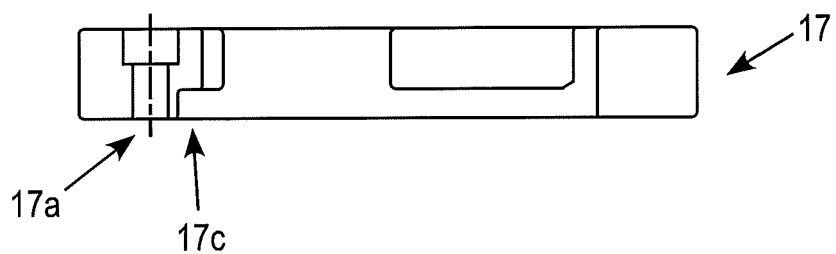

FIG. 5A shows an annular insert 17 with a three pronged bayonet opening 17c which is secured in the cylindrical recess 15a of the window 15. FIG. 5B shows a top view of the annular insert 17 which has three stepped holes 17a which are 120° apart. The insert preferably has an outer diameter of about 3.4 inches and a thickness of about 0.5 inch. The stepped holes 17a are preferably about 0.3 inch in diameter at upper portions thereof and about 0.2 inch in diameter at lower portions thereof, with all three stepped holes located on a radius of about 1.3 inches from the center of central bore 17c. The stepped holes 17a receive bolts which can be threaded into threaded holes in the window or polymer sleeves located in the blind holes 15b of the window 15.

The annular insert 17 has three inwardly extending protrusions 17b that form the bayonet opening. Preferably, each protrusion extends about 58° in a circumferential direction and the space between adjacent protrusions extends about 62° whereby midpoints of the protrusions are spaced 120° apart. The inner surfaces of the protrusions 17b lie on a circle having a diameter of about 2 inches. The protrusions 17b have a height of about 0.35 inch and extend inwardly about 0.15 inch from the bayonet opening which has a diameter of about 2.3 inches.

To mount an injector 16 in the window, the insert 17 can be secured in the cylindrical recess 15a of the window with bolts engaging threaded inserts in the blind holes 15b. Then, an injector 16 with surrounding RF shield 18 and faceplate 19 is inserted such that the lower end of the injector extends through central bore 15c and the faceplate 19 is rotated such that three outwardly extending flanges 19c on the lower end of the faceplate 19 are engaged in the gaps between the protrusions 17b and the upper surface of the window 15.

Figure 6A:
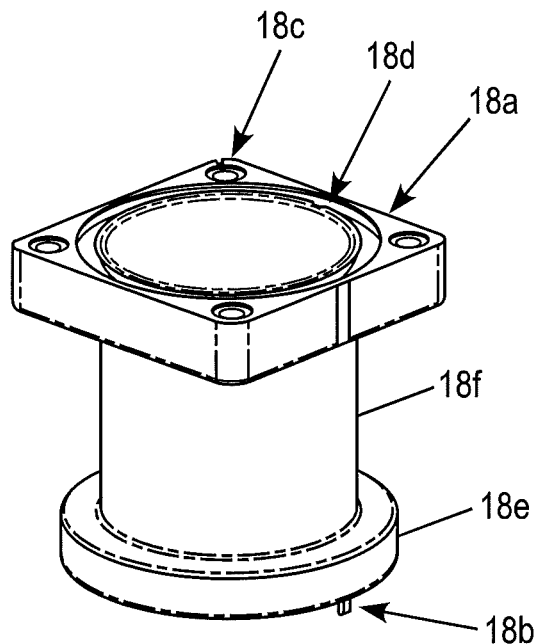

FIG. 6A is a perspective view of the RF shield 18 which includes a square upper section 18a, a pin 18b, four threaded holes 18c, an O-ring groove 18d, four threaded holes 18c, a lower cylindrical section 18e and an intermediate cylindrical section 18f. The four threaded holes 18c receive bolts attaching the RF shield 18 to a gas connection block 21 (see FIG. 1) having two gas lines 21a, 21b for supplying the inner gas outlets 16a and outer gas outlets 16d of the injector 16. The O-ring groove 18d receives an O-ring to provide a gas seal between the gas connection block 21 and the RF shield 18. Another O-ring in the bottom of the gas connection block 21 provides a gas seal between the top of the injector 16 and the gas connection block 21. The lower cylindrical section 18e and the intermediate cylindrical section 18f of the RF shield 18 fit over the injector 16 such that and upper part of the pin 18b engages a groove on the outer surface of the injector 16 and a lower part of the pin 18b fits in the alignment pin hole 15k.

Figure 6B:
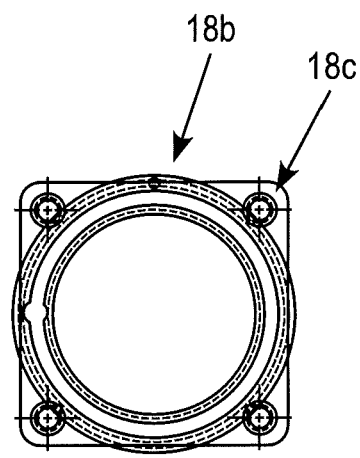
Figure 6C:
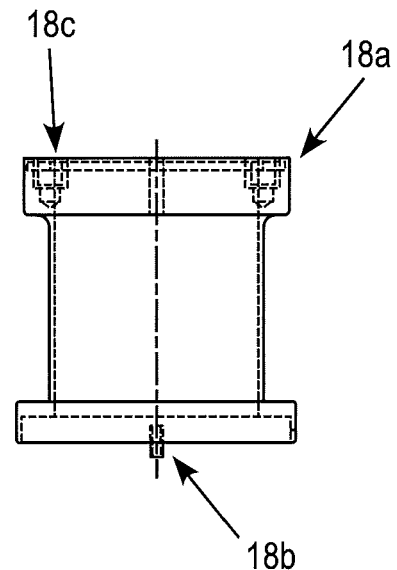

FIG. 6B is a top view of the RF shield 18 and FIG. 6C is a side view of the RF shield 18. The RF shield 18 is preferably made of metal such as copper or aluminum optionally plated with a metal such as silver.

FIGS. 7A-D show details of the faceplate 19. The faceplate 19 includes two halves which bolt together around the RF shield 18 and the bottom of the faceplate includes a twist-and-lock arrangement for securing the injector 16, RF shield 18 and faceplate 19 in the insert 17.

FIGS. 7A-D show a half section of the faceplate 19 which when attached to the other half section forms a cylindrical inner region 19a and a hexagonal outer region 19b having three inclined protrusions 19c at the lower end thereof. One half section includes threaded holes 19d on the side face 19f for receiving bolts extending from the other half section to attach the two half sections together. The side face 19f also includes alignment pin holes 19e which receive alignment pins extending from the other half section.

Each half section of the faceplate 19 includes three corners 19g where four outer surfaces meet at 120°. The bottom of each half section includes a step 19h which fits over the lower cylindrical section 18e of the RF shield 18. Gaps 19i between the protrusions 19c are sized to allow the protrusions 17b of the insert 17 to slide along the outside of the faceplate 19 and when the bottom of the faceplate 19 engages the window 15, the faceplate 19 can be rotated to move the protrusions 19c into the gaps 17c under the protrusions 17b. The faceplate is rotated until the protrusions 19c engage the undersides of the protrusions 17b and three vertical ribs 19j above each protrusion 19c provide a frictional fit between the inner surfaces of the protrusions 17b and the outer surface of the faceplate 19.

Figure 7A:
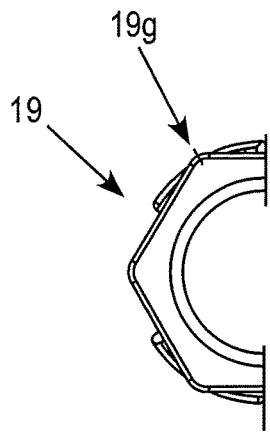
Figure 7B:
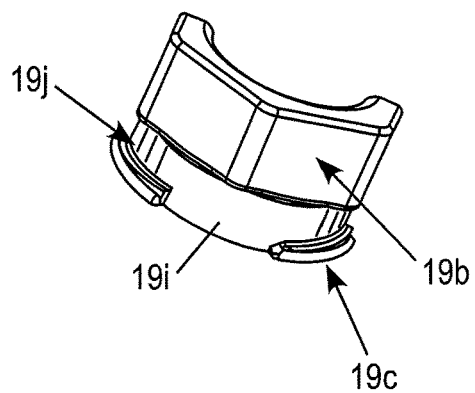
Figure 7C:
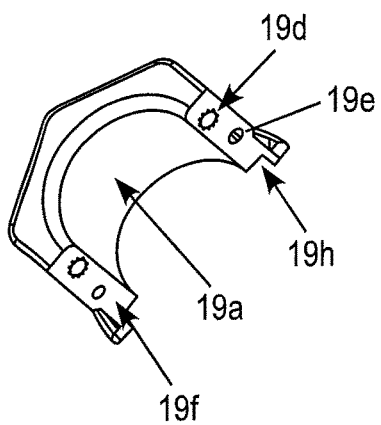
Figure 7D:
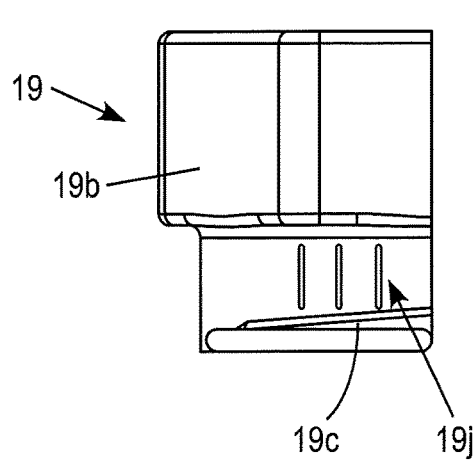

FIG. 7D is a perspective side view of one of the half sections showing the hexagonal outer region 19b and one of the protrusions 19c which is preferably inclined at an angle of about 4° and three vertical ribs 19i are provided above the protrusion 19c.

The annular insert 17, the RF shield 18 and the faceplate 19 provide an improved mounting system for a gas injector 16 in a dielectric window 15. The improved mounting system overcomes problems with dielectric windows having bayonet openings for mounting injectors therein which were apt to chip and become damaged due to the brittleness of the window material.

The annular insert with the bayonet opening fits in a window's cylindrical recess and is adhered to the window with bolts engaging threaded inserts fitted in holes in the recess of the window. Alternatively, the insert can be bonded to the window with a suitable bonding material. Windows with low tensile strengths, such as quartz suffer from chipping when the bayonet opening is machined into the window. Low tensile strengths in the quartz window chip due to a point load being placed on the window when the gas injector assembly is installed. The insert is preferably made from a material having a higher tensile strength than the window preferably from a plastic such as "ULTEM" but any other suitable material can be used for the insert such as a ceramic, metal, silicon carbide, graphite, etc. The insert constructed from a non-brittle material will eliminate the mounting issues associated with window members chipping when constructed from materials with low tensile yield strengths.

In a most preferred mounting arrangement, the gas injector with a flange, which has a groove on the bottom for an O-ring, sits on the quartz disk's recess and is vacuum sealed to the window with an O-ring in the groove of the flange to provide a seal between the gas injector and the opening in the window, and an annular insert with a bayonet opening is adhered to the quartz window. In another embodiment the gas injector is mounted in an opening in the window with one or more O-rings between the flange on the gas injector and the quartz window. The gas outlets on the distal of the gas injector are preferably located below or flush with the inner surface of the window. A faceplate with three protrusions (lugs) is inserted into the insert with the bayonet opening and the lugs are hand tightened to hold the injector in place. In a preferred embodiment, an RF shield surrounds the gas injector and the faceplate surrounds the RF shield.

The gas injector is preferably made from a dielectric material such as quartz. Alternatively, the injector can be made from other material such as aluminum, stainless steel, alumina, silicon nitride, etc. The gas outlets can have any desired shape such as uniform diameter along the entire length thereof or other shape such as conically tapered, flared surfaces or radially contoured surfaces. The gas outlets can be oriented to inject the gas in any direction, including directly at the substrate and/or at an acute angle with respect to the substrate. In a preferred embodiment, 19 axially extending gas outlets are arranged on the distal end of the gas injector in a hexagonal arrangement and eight non-axially extending gas outlets are located near or on the outer aside wall of the injector.

The gas injector is thus clamped in place by the faceplate which is inserted into the bayonet opening of the insert. In a most preferred embodiment, the faceplate is hand tightened to the insert by three lugs whereby the faceplate may be inserted in a twist and lock fashion into the bayonet opening of the insert. The outer surface of the faceplate can have a hexagonal shape to allow hand tightening of the faceplate in the bayonet opening of the insert.

Having disclosed exemplary embodiments and the best mode, modifications and variations may be made to the disclosed embodiments while remaining within the subject and spirit of the invention as defined by the following claims.

What is claimed is:

1. A dielectric window mountable in a plasma processing chamber, the dielectric window comprising:
a disk having a uniform thickness;
a lower vacuum sealing surface of the dielectric window adapted to seal against an upper surface of the plasma processing chamber;
a central bore configured to receive a gas injector configured to deliver a process gas into a center of the plasma processing chamber;
an upper recess in an upper surface surrounding the central bore and configured to receive a portion of the gas injector and an annular insert, wherein the upper recess is defined by a cylindrical sidewall and a planar bottom wall, and wherein the annular insert is configured to secure the portion of the gas injector on the planar bottom wall; and
trenches extending circumferentially in respective outer peripheral portions of the disk,
wherein
each of the trenches is an elongated trench and extends a predetermined length along a periphery of the dielectric window,
each of the trenches has (i) a pair of planar walls, (ii) a curved bottom wall, and (iii) an elongated opening along a circumferential edge of the dielectric window
the elongated opening of each of the trenches has a first end and a second end,
the curved bottom wall of at least one of the trenches has a radially innermost edge,
the radially innermost edge of each of the at least one of the trenches extends linearly from the first end to the second end of the corresponding elongated opening,
the planar walls of each of the trenches are parallel to each other,
the at least one of the trenches extends radially inward away from an outer side surface of the dielectric window, wherein a depth of each of the at least one of the trenches is non-uniform along the corresponding radially innermost edge from the first end to the second end of the corresponding elongated opening,
the planar bottom wall includes vertical mounting holes spaced apart and located between the central bore and the sidewall, and
the vertical mounting holes are configured to secure the annular insert and the gas injector to the planar bottom wall.

2. The dielectric window of claim 1, further comprising:
a blind hole for receipt of a temperature sensor in the upper surface; and
an indentation on an outer edge of the lower vacuum sealing surface.

3. The dielectric window of claim 1, wherein the trenches include four circumferentially extending trenches in the outer periphery with midpoints of the four circumferentially extending trenches being spaced 90° apart.

4. The dielectric window of claim 1, wherein the planar bottom wall of the upper recess includes three vertical mounting holes spaced 120° apart and located midway between the central bore and the cylindrical sidewall.

5. The dielectric window of claim 4, wherein:
the planar bottom wall is a vacuum sealing surface and includes an alignment hole configured to receive an alignment pin on a lower end of an RF shield of an injector assembly; and
the injector assembly includes the gas injector and the annular insert.

6. The dielectric window of claim 1, wherein:
the dielectric window has a diameter of 20 inches and a thickness of 1.75 inches;
the lower vacuum sealing surface is an annular vacuum sealing surface that is 1 inch wide and is on an outer bottom portion of the dielectric window; and
the upper recess has a diameter of 3.4 inches and a depth of 0.5 inches; and
the central bore has a diameter of 1 inch.

7. The dielectric window of claim 2, wherein the blind hole has a diameter of 0.22 inches, a depth of 1.2 inches and a tapered opening with a diameter of 0.48 inches.

8. The dielectric window of claim 4, wherein:
the mounting holes are located 1.25 inches from a center of the central bore; and
each of the mounting holes has a diameter of 0.4 inches and a depth of 0.5 inches.

9. The dielectric window of claim 5, wherein the alignment hole is located 0.9 inches from the center of the central bore, has a diameter of 0.09 inches and a depth of 0.15 inches.

10. A dielectric window mountable in a plasma processing chamber, the dielectric window comprising:
a disk having a uniform thickness;
a lower vacuum sealing surface adapted to seal against an upper surface of the plasma processing chamber;
a central bore configured to receive a gas injector, wherein the gas injector delivers process gas into a center of the plasma processing chamber;
an upper recess in an upper surface surrounding the central bore and configured to receive an annular insert, wherein the annular insert is used to mount a gas injector assembly on the dielectric window, wherein the gas injector assembly includes the gas injector;
trenches in an outer periphery of the disk, wherein each of the trenches extends a predetermined length and along a respective peripheral portion of the dielectric window, wherein at least one of the trenches has a non-uniform depth and extends radially inward away from an outer side surface of the dielectric window;
a blind hole configured to receive a temperature sensor in the upper surface; and
an indentation on an outer edge of the lower vacuum sealing surface,
wherein
the trenches include four circumferentially extending trenches in the outer periphery of the dielectric window with midpoints of the four circumferentially extending trenches being spaced 90° apart,
the four circumferentially extending trenches include the at least one of the trenches with the non-uniform depth, each of the trenches has (i) a pair of planar walls, (ii) a curved bottom wall, and (iii) an elongated opening along a circumferential edge of the dielectric window, the elongated opening of each of the trenches has a first end and a second end, the curved bottom wall of each of the at least one of the trenches has a radially innermost edge, the radially innermost edge of each of the at least one of the trenches extends linearly from the first end to the second end of the corresponding elongated opening, a depth of each of the at least one of the trenches is non-uniform along the corresponding radially innermost edge from the first end to the second end of the corresponding elongated opening, the planar walls of each of the trenches are parallel to each other, the upper recess is defined by a cylindrical sidewall and a planar bottom wall, the planar bottom wall includes three vertical mounting holes spaced 120° apart and located midway between the central bore and the cylindrical sidewall, the vertical mounting holes are for securing the annular insert and the gas injector to the upper recess of the dielectric window, the planar bottom wall is a vacuum sealing surface and includes an alignment hole configured to receive an alignment pin on a lower end of a radio frequency shield of the gas injector assembly, the gas injector assembly includes the gas injector and the annular insert, the dielectric window has a diameter of 20 inches and a thickness of 1.75 inches, the lower vacuum sealing surface is an annular vacuum sealing surface that is 1 inch wide and is on an outer bottom portion of the dielectric window, the upper recess has a diameter of 3.4 inches and a depth of 0.5 inches, the central bore has a diameter of 1 inch, the blind hole has a diameter of 0.22 inches, a depth of 1.2 inches and a tapered opening with a diameter of 0.48 inches, the mounting holes are located 1.25 inches from the center of the central bore, each of the mounting holes has a diameter of 0.4 inches and a depth of 0.5 inches, the alignment hole is located 0.9 inches from the center of the central bore and has a diameter of 0.09 inches and a depth of 0.15 inches, each of the trenches has a width of 0.6 inches, and the planar bottom wall is circular and has a radius of curvature of 0.3 inches.

11. The dielectric window of claim 2, wherein:
the indentation is concave and is in the outer periphery of the dielectric window;
the indentation has a depth of 0.3 inches and is defined by a planar surface parallel to the lower vacuum sealing surface and a curved sidewall; and
the curved sidewall extends into the outer periphery and has a radius of curvature of 0.4 inches.

12. The dielectric window of claim 1, wherein the dielectric window consists of quartz.

13. The dielectric window of claim 1, wherein one of the trenches has a maximum depth at a center of the one of the trenches.

14. A dielectric window mountable in a plasma processing chamber the dielectric window comprising:
a disk having a uniform thickness;
a lower vacuum sealing surface of the dielectric window adapted to seal against an upper surface of the plasma processing chamber;
a central bore configured to receive a gas injector configured to deliver a process gas into a center of the plasma processing chamber;
an upper recess in an upper surface surrounding the central bore and configured to receive a portion of the gas injector and an annular insert, wherein the upper recess is defined by a cylindrical sidewall and a planar bottom wall, and wherein the annular insert is configured to secure the portion of the gas injector on the planar bottom wall; and
trenches extending circumferentially in respective outer peripheral portions of the disk,
wherein
each of the trenches is an elongated trench and extends a predetermined length along a periphery of the dielectric window,
each of the trenches has a pair of planar walls and a curved bottom wall,
the planar walls of each of the trenches are parallel to each other,
one of the trenches has a non-uniform depth and extends radially inward away from an outer side surface of the dielectric window,
the one of the trenches has a maximum depth not at a center of the one of the trenches,
the planar bottom wall includes vertical mounting holes spaced apart and located between the central bore and the sidewall, and
the vertical mounting holes are configured to secure the annular insert and the gas injector to the planar bottom wall.

15. The dielectric window of claim 14, wherein a second one of the trenches has a maximum depth at a center of the second one of the trenches.

16. The dielectric window of claim 1, wherein each of the trenches extends $\frac{1}{8}^{th}$ of a circumference of the dielectric window.

17. The dielectric window of claim 1, wherein each of the trenches has a non-uniform depth.

18. The dielectric window of claim 1, wherein at least one of the trenches has a non-uniform depth in both circumferential and vertical directions at points on a lateral plane extending radially through the dielectric window.

19. The assembly of claim 10, wherein one of the trenches has a maximum depth not at a center of the one of the trenches.

20. The assembly of claim 19, wherein a second one of the trenches has a maximum depth at a center of the second one of the trenches.

21. The dielectric window of claim 10, wherein each of the trenches extends $\frac{1}{8}^{th}$ of a circumference of the dielectric window.

22. The dielectric window of claim 10, wherein each of the trenches has a non-uniform depth.

23. The dielectric window of claim 10, wherein at least one of the trenches has a non-uniform depth in both circumferential and vertical directions at points on a lateral plane extending radially through the dielectric window.

24. A dielectric window mountable in a plasma processing chamber comprising, the dielectric window comprising:
a disk having a uniform thickness;

a lower vacuum sealing surface of the dielectric window adapted to seal against an upper surface of the plasma processing chamber;

a central bore configured to receive a gas injector configured to deliver a process gas into a center of the plasma processing chamber;

an upper recess in an upper surface surrounding the central bore and configured to receive a portion of the gas injector and an annular insert, wherein the upper recess is defined by a cylindrical sidewall and a planar bottom wall, and wherein the annular insert is configured to secure the portion of the gas injector on the planar bottom wall; and trenches extending circumferentially in respective outer peripheral portions of the dielectric window, wherein each of the trenches is an elongated trench and extends a predetermined length along a periphery of the dielectric window, each of the trenches has (i) a pair of planar walls, (ii) a curved bottom wall, and (iii) an elongated opening along a circumferential edge of the dielectric window, the elongated opening of each of the trenches has a first end and a second end, the curved bottom wall of each of the trenches has a radially innermost edge, a radial cross-section of at least one of the trenches is semi-circularly-shaped, the radially innermost edge of each of the at least one of the trenches extends linearly from the first end to the second end of the corresponding one of the elongated openings, the planar walls of each of the trenches are parallel to each other, the at least one of the trenches has a non-uniform depth and extends radially inward away from an outer side surface of the dielectric window, the planar bottom wall includes vertical mounting holes spaced apart and located between the central bore and the sidewall, and the vertical mounting holes are configured to secure the annular insert and the gas injector to the planar bottom wall.

\* \* \* \* \*